US006858474B1

United States Patent
Koay et al.

(10) Patent No.: US 6,858,474 B1
(45) Date of Patent: Feb. 22, 2005

(54) WIRE BOND PACKAGE AND PACKAGING METHOD

(75) Inventors: Hean Tatt Koay, Lebuhraya Thean Teik (MY); Kong Hoong Chew, Taman Sungai Ara (MY); Beng Huat Low, Lengkok Nipah (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/725,669

(22) Filed: Dec. 1, 2003

(51) Int. Cl.[7] .................. H01L 21/44; H01L 21/48; H01L 21/50
(52) U.S. Cl. ........................... 438/123; 438/106
(58) Field of Search ................ 438/123, 51, 55, 438/64, 106, 107, 108, 110, 111, 113, 118, 122, 124, 125, 126, 127

(56) References Cited

U.S. PATENT DOCUMENTS

| | | | | |
|---|---|---|---|---|
| 6,143,981 A | * | 11/2000 | Glenn | 174/52.4 |
| 6,415,977 B1 | * | 7/2002 | Rumsey | 235/454 |
| 6,420,779 B1 | * | 7/2002 | Sharma et al. | 257/666 |
| 6,555,400 B2 | * | 4/2003 | Farnworth et al. | 438/17 |
| 6,808,947 B2 | * | 10/2004 | Farnworth et al. | 438/16 |

* cited by examiner

Primary Examiner—David Nhu (57) ABSTRACT

A method for packaging a plurality of dies is disclosed. Each die is attached to a corresponding mounting station in a structural member that includes a base member having first and second surfaces and a plurality of mounting stations. Each mounting station has a cavity wall that surrounds that mounting station and extends from the first surface thereby forming an open cavity around the mounting station. After the dies have mounted, a lid sheet is positioned over the structural member. The lid sheet includes a plurality of covers for closing the cavities. The covers are connected to one another by connection members. The structural member with the positioned lid sheet is then placed in a mold with a molding compound in contact with the lid sheet. The mold has a surface that forces the covers against the cavity while forcing the molding compound between the cavity walls.

7 Claims, 7 Drawing Sheets

WIRE BOND PACKAGE AND PACKAGING METHOD

FIELD OF THE INVENTION

The present invention relates to semiconductor packaging systems.

BACKGROUND OF THE INVENTION

Semiconductor circuits are fabricated on chips th at are then mounted in various forms of packages that are, in turn, incorporated into larger circuits that are assembled on printed circuit boards or the like. Ideally, the packaging operation is carried out on a large number of dies that are packaged together. In this arrangement, the dies are connected to a lead frame that consists of a number of copper traces that are connected together to form a single fabric. After the dies are bonded to the traces, connections are made between the pads on the die and the traces via wire bonds, or the like. A plastic layer is molded over the dies to protect the dies. The resultant sheet is then divided into individual packaged circuits by cutting the sheet along lines that separate the various dies and remove the portions of the fabric that were intended merely to keep the sheet together during the packaging process.

One class of integrated circuit requires that the space over the die be a cavity that is evacuated or filled with a gas. For example, RF circuits require such an air gap. This cavity must be sealed to protect the integrated circuit and or prevent the environment over the die from being altered by the air that surrounds the package.

A number of prior art methods have been proposed to provide such a cavity in an inexpensive plastic package. For example, U.S. Pat. No. 5,946,556 teaches a packaging system in which a lid is used to create a cavity over the die. This design requires that the air cavity be sealed using adhesive. In addition, the lid covers must be attached to the dies one at a time. The adhesive seal of the lid to the underlying portion of the package is not sufficiently reliable. In addition, the need to individually place the lids over the dies substantially increases the manufacturing time, and hence, the cost of the packaged part. An arrangement which utilizes the mold compound to seal the lid over the air cavity is taught in U.S. Pat. No. 5,362,679. While this arrangement solves the problem associated with the lack of reliability of the adhesive seats, the method still requires that each of the metal caps be individually placed over the dies prior to the encapsulation process. Hence, the problems associated with manufacturing time still remain.

SUMMARY OF THE INVENTION

The present invention includes a method for packaging a plurality of dies. The method starts by attaching each die to a corresponding mounting station in a structural member that includes a base member having first and second surfaces. The base member includes a plurality of mounting stations. Each mounting station has a cavity wall that surrounds that mounting station and extends from the first surface thereby forming an open cavity around the mounting station. After the dies have been mounted, a lid sheet is positioned over the structural member. The lid sheet includes a plurality of covers for closing the cavities. The covers are connected to one another by connection members. The structural member with the positioned lid sheet is then placed in a mold with a molding compound in contact with the lid sheet. The mold has a surface that forces the covers against the cavity while forcing the molding compound between the cavity walls. Once the molding compound has solidified, the molded sheet is then divided into the individual packaged dies. In one embodiment, one or more of the connection members include a spring member that extends away from the covers and the first surface. The spring member is in contact with the mold surface when the molding compound is forced between the cavity walls, and hence, forces the covers against the cavity wall to assure that the cavity is sealed by the cover and overlying molding compound. In another embodiment, the mounting stations include a die mounting pad and a plurality of wire bonding pads for making connections to the signal and power pads on the die. The die is preferably mounted on the die mounting pad using a heat conducting adhesive so that the die mounting pad can provide a heat sink function. In another embodiment, the base member includes a lead frame that is partially encased in a mold compound.

DETAILED DESCRIPTION OF THE PREFERRED EMBODIMENTS

Figure 1:
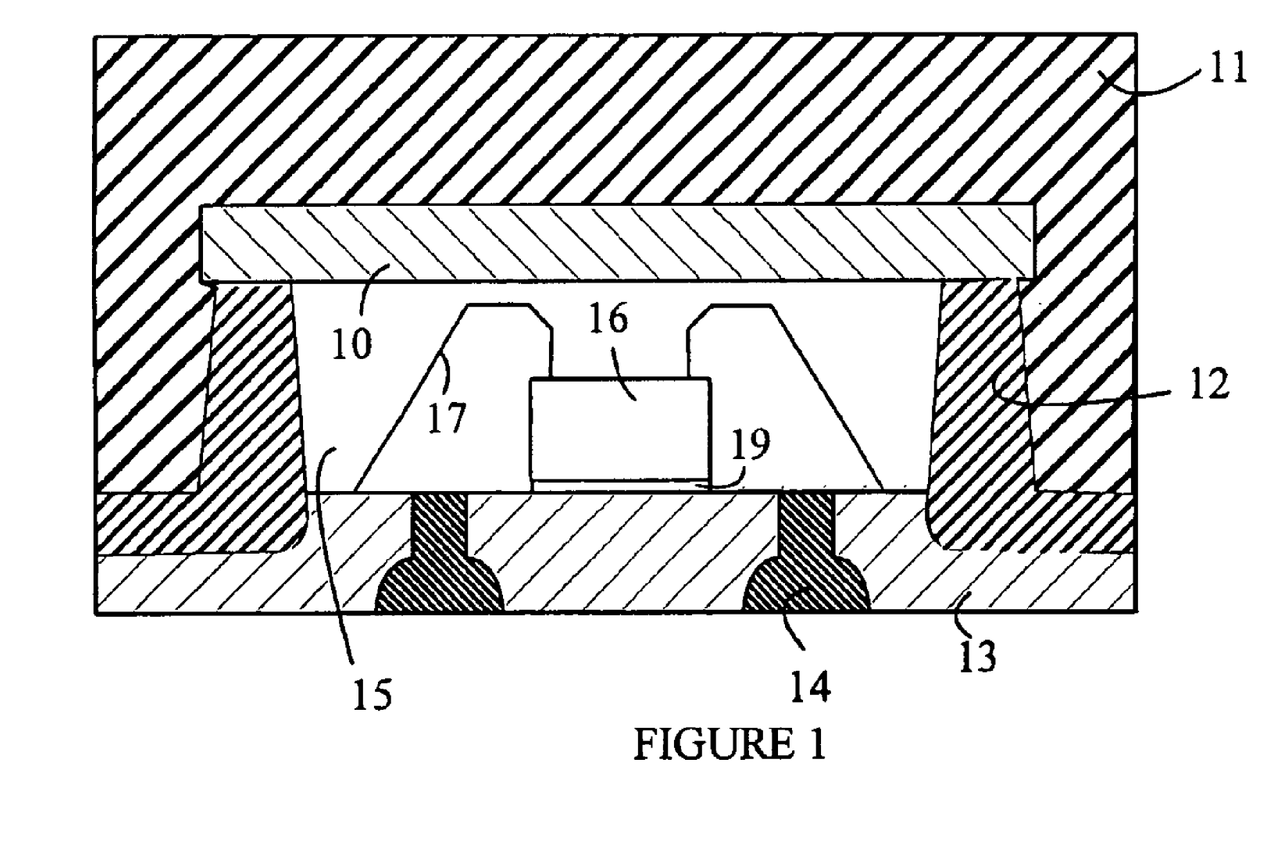
FIG. 1 is a cross-sectional view of a packaged chip according to one embodiment of the present invention.

The manner in which the present invention provides its advantages can be more easily understood with reference to FIG. 1, which is a cross-sectional view of a packaged chip according to one embodiment of the present invention. The die 16 is connected to a half etched lead frame 13 by a layer of adhesive 19. Half-etched lead frames are known to the art, and hence, will not be discussed in detail here. Lead frames of th is type are discussed in detail in U.S. Pat. No. 6,420,779, which is hereby incorporated by reference. For the purposes of this discussion, it is sufficient to note that a lead frame may be viewed as a fabric of copper traces that wilt eventually form the interconnect points power and signal pads on the die and the connection points on the outside of the package. These connection poi nts are used to connect the packaged integrated circuit to a printed circuit board or the like. The fabric can be viewed as having a top and bottom surface. The die is bonded to the top surface of the lead frame. The bottom surface of the lead frame 13 includes cavities 14 that are filled with mold compound during the molding process. The extension of the mold compound under the lead frame in these areas increases the strength of the bond between the conducting lead frame and the package, and hence, prevents the separation of the lead frame from the package.

In this embodiment of the present invention, the lead frame is pre-molded with mold compound to fill up the gap between the metal traces on the underside of the molded part. The pre-molded structure also includes a cavity wall 12. Die 16 is attached to the pre-molded lead frame at the center of cavity 15. Power and signal pads on Die 16 are connected to lead frame 13 by gold wires 17 using conventional bonding. A metal cap 10 covers the pre-molded cavity wall 12. As will be explained in more detail below, metal cap 10 is formed from a sheet having a plurality of metal caps and then separated from the sheet during the final die singulation process. The metal cap is covered with a layer 11 of mold compound to seal the metal cap to the package and assure that the cavity is sealed.

Figure 2:
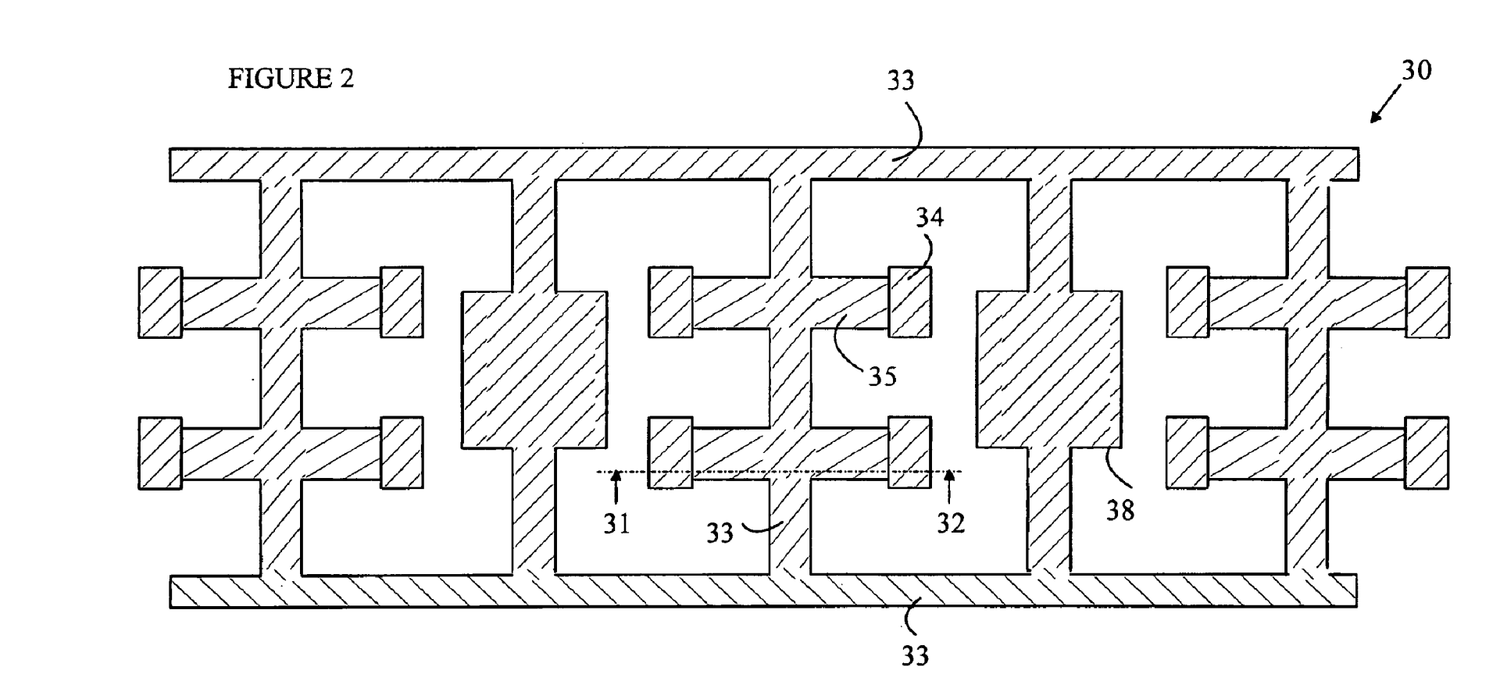
FIGS. 2–7 illustrate the packaging of two dies by the method of one embodiment of the present invention.

The manner in which a group of dies is packaged utilizing the method of the present invention will now be explained with the aid of FIGS. 2–7, which illustrate the packaging of two dies by the method of one embodiment of the method of the present invention. Refer now to FIG. 2, which is a top view of a portion of a lead frame 30 that forms the starting point for this embodiment of the present invention. To simplify the drawing only the portions of the lead frame needed to package 2 dies are shown; however, it is to be understood that the lead frame is, in general, a much larger two-dimensional fabric. Lead frame 30 includes a number of copper traces that will form the connection points between a die and the printed circuit board on which the packaged part will eventually be placed.

For example, trace 38 is a pad to which the die will be attached. Trace 38 also provides a heat sink and heat conduction path for moving heat off of the die to the printed circuit board. In addition, trace 38 can provide a connection point to a terminal on the bottom of the die. Trace 34 is a connection point for one of the gold wire connections discussed above. Trace 34 is connected to trace 35, which provides the connection to the printed circuit board. Finally, there are a number of other traces 33 that form a backbone that connects the various leads together during the fabrication process. At the end of the fabrication process these traces will be removed by cutting the finished sheet of dies, thereby leaving the other traces as isolated conductors within the final package.

Figure 3:
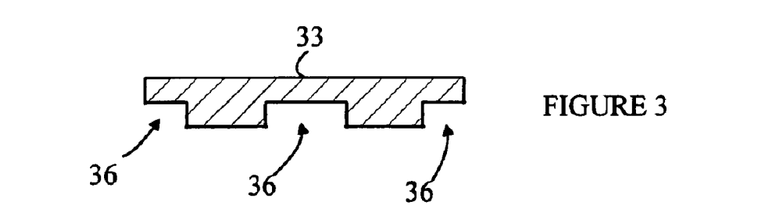

As noted above, lead frame 30 is preferably a half-etched lead frame. Refer now to FIG. 3, which is a cross-sectional view of lead frame 30 through line 31-32. As can be seen from FIG. 3, the undersides of the traces are etched to form the cavities shown at 36. When molding compound is applied to the lead frame, these cavities are filled by the molding compound during the molding process. As a result, the conductors are molded into the block of molding compound such that each conductor is surrounded by mold compound rather than just being attached to the outer surface of the block molding compound. This arrangement prevents the conductors from separating from the final package.

Figure 4:
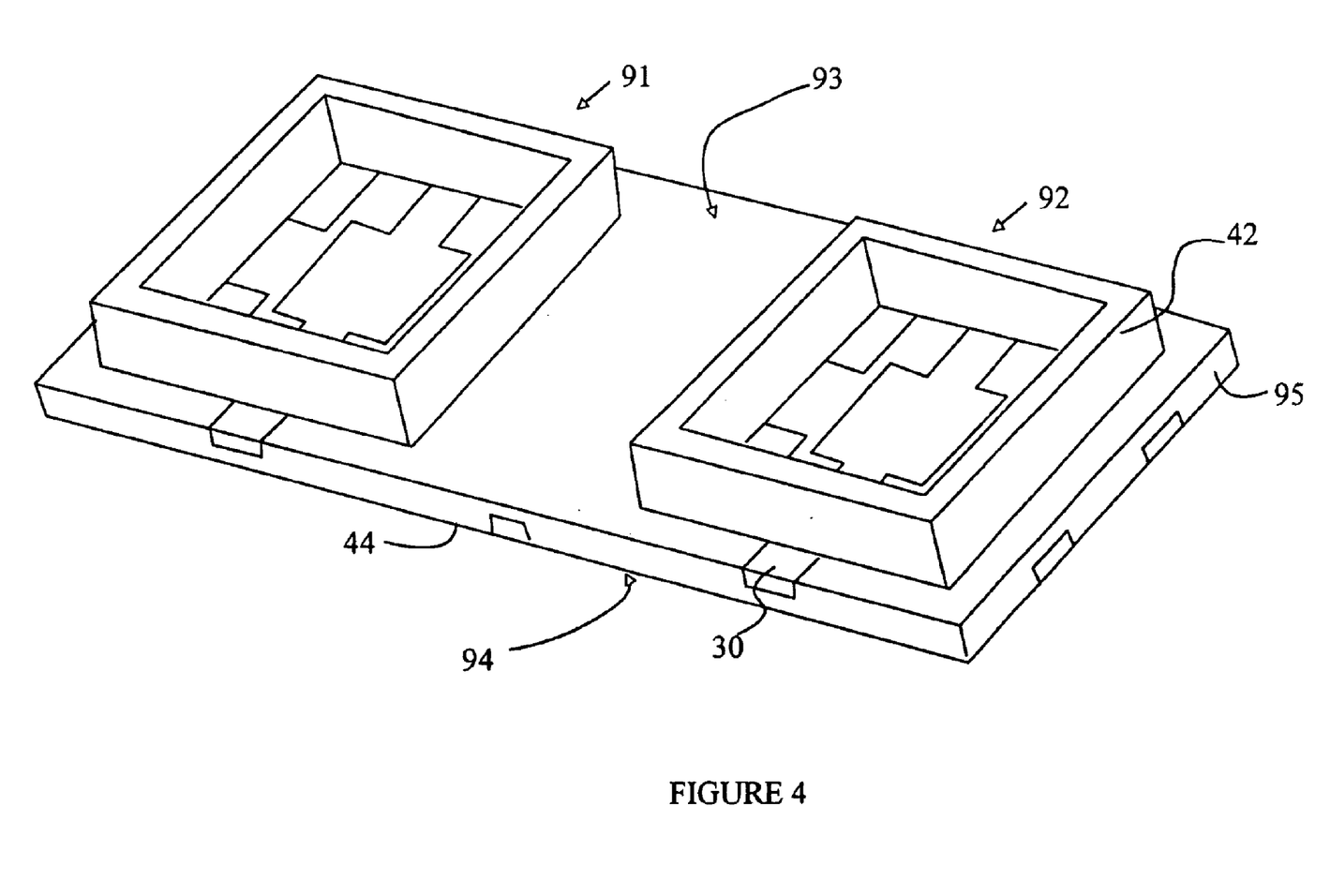

Refer now to FIG. 4, which is a perspective view of the lead frame shown in FIG. 2 after the first molding step. Two mounting stations are shown in the figure at 91 and 92. Lead frame 30 is molded with mold compound 44 to fill the gap between the lead frame metal and the cavity wall 42. This molding step also fills the cavities shown at 36 in FIG. 3. This first molding process provides a structural member 95 having a top surface 93 and a bottom surface 84 and leaves the top surface of the lead frame within cavity wall 42 uncovered.

Figure 5:
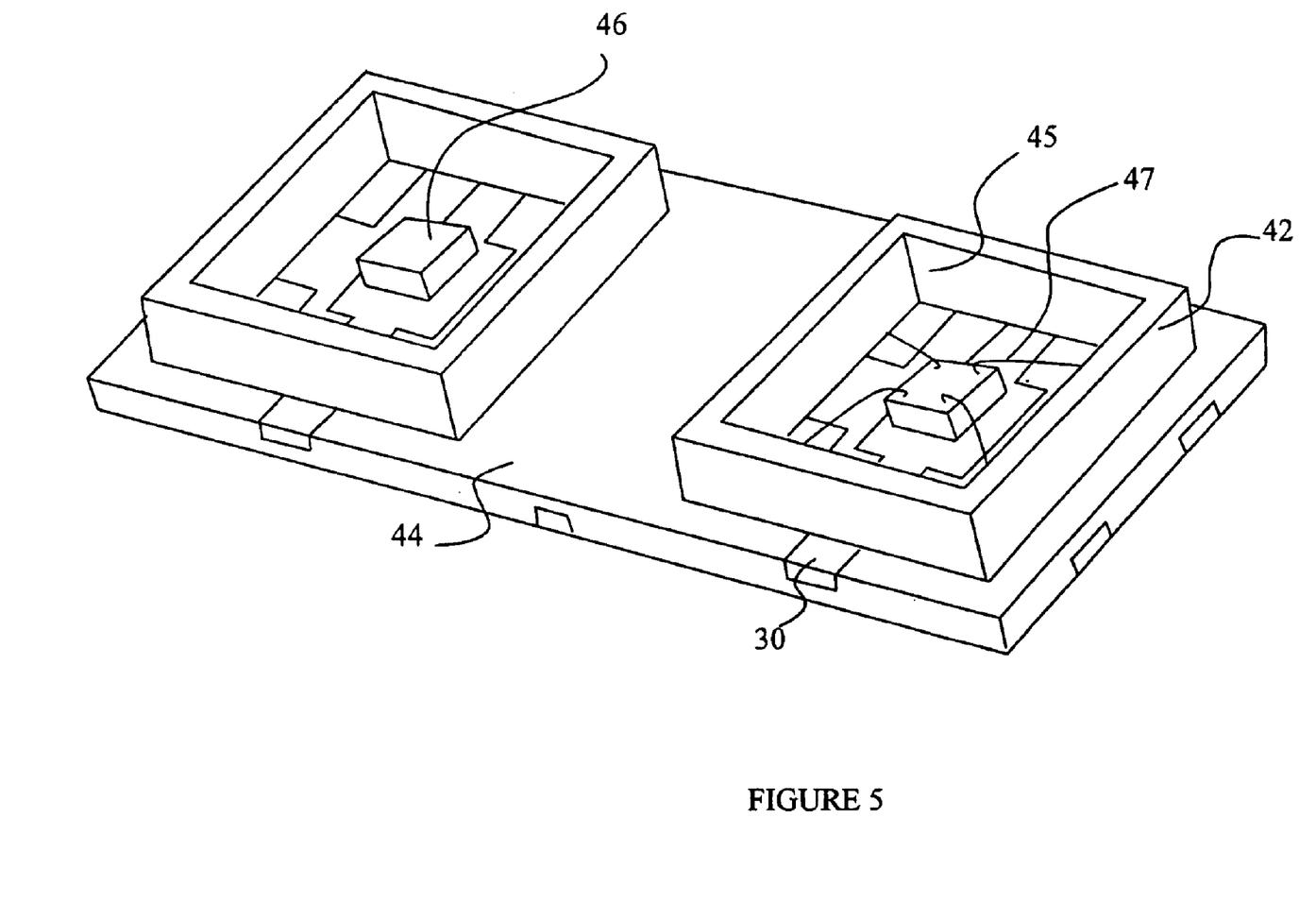

Refer now to FIG. 5, which is a perspective view of the lead frame shown in FIG. 4 after the dies have been mounted. Die 46 is attached to the lead frame using an adhesive 110 layer that is preferably heat conducting. The connections between the signal and power pads on die 46 and the lead frame are made using gold wires shown at 47. At the end of this step, the dies are mounted in the cavities shown at 45 and connected to the lead frame.

Figure 6:
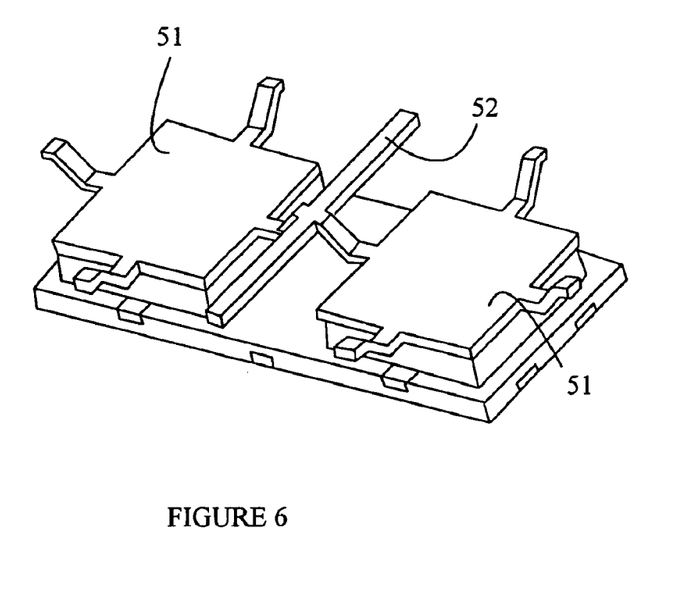

Next, the metal cap that forms the top of the cavity is applied. Refer now to FIG. 6, which is a perspective view of the lead frame shown in FIG. 5 with the metal tops in place. The metal tops are part of a common sheet of material that is analogous to the lead frame discussed above, but without the half-etch feature. The tops 51 are joined together by spring members 52 to form a sheet of material having openings between the cavities. It should be noted that the spring members extend above the tops.

The spring members provide two functions. First, the spring members provide access to the area between the tops so that the molding compound can be introduced into this area in a subsequent step while allowing the tops to be placed as a single sheet over the entire group of dies that are being packaged. Since the sheet containing the tops is placed over a large number of dies in a single operation, the time consuming individual top placement process inherent in the prior art methods discussed above is avoided.

The spring members also assure that the tops of the cavities are held firmly against the cavity walls during the final molding process thereby assuring a tight seal for the cavity.

Figure 7:
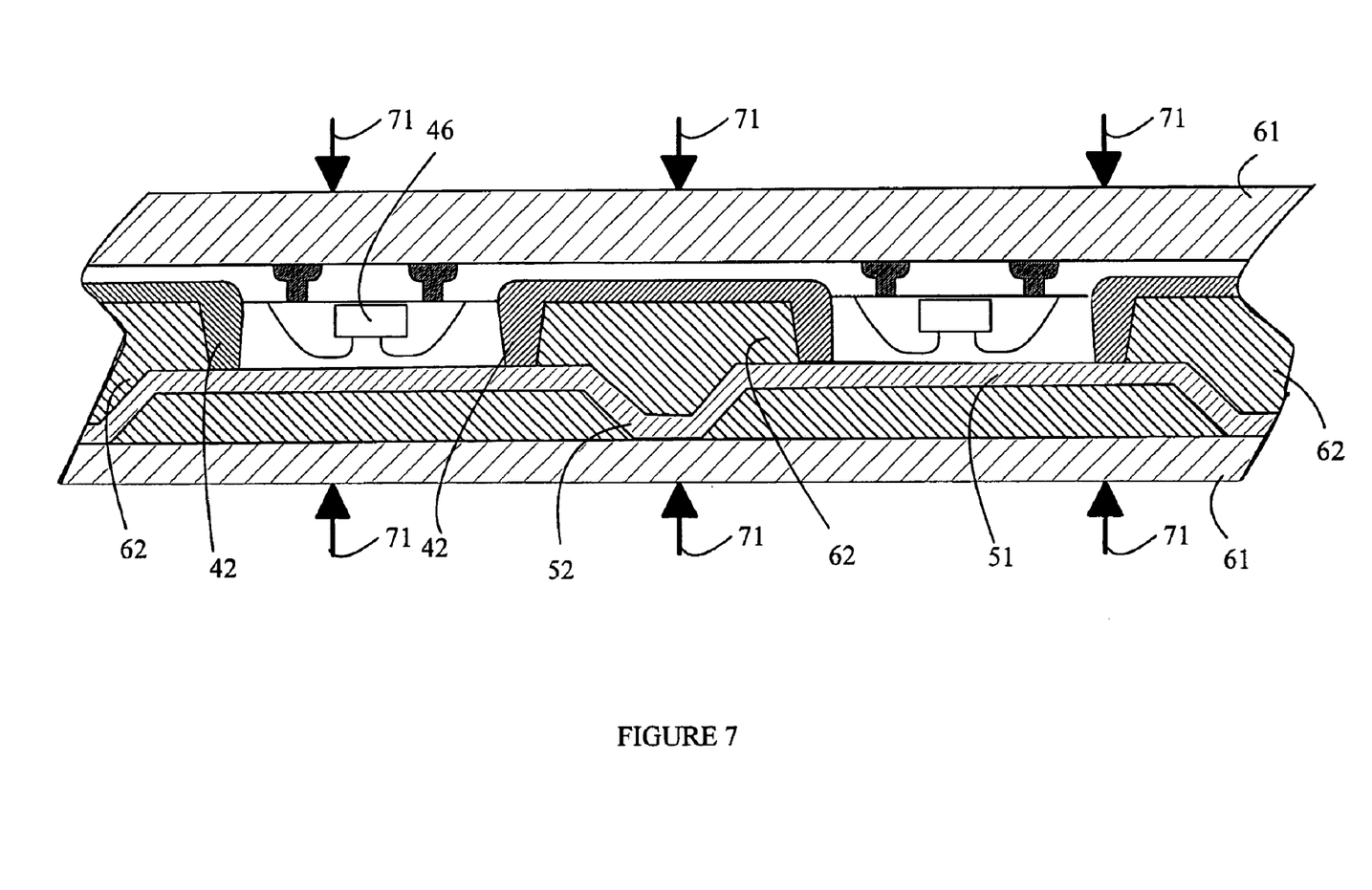

Refer now to FIG. 7, which is a cross-sectional view of a portion of the sheet of partially packaged dies during the final molding process. The sheet is placed upside down in a mold cavity that is defined by the plates shown at 61. The plates are pressed together as indicated by the arrows shown at 71. The molding compound 62 is extruded into the spaces above the tops and between the cavity walls as shown in the figure. As the plates move together, spring members 52 are forced against the bottom plate and provide a force that presses the tops 51 against the top rim of the cavity walls 42.

Figure 8:
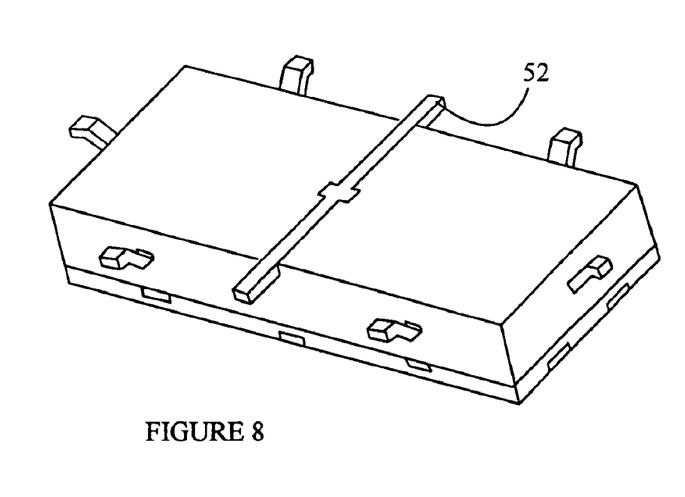
FIG. 8 is a perspective view of the packaged parts after the final molding operation.
Figure 9:
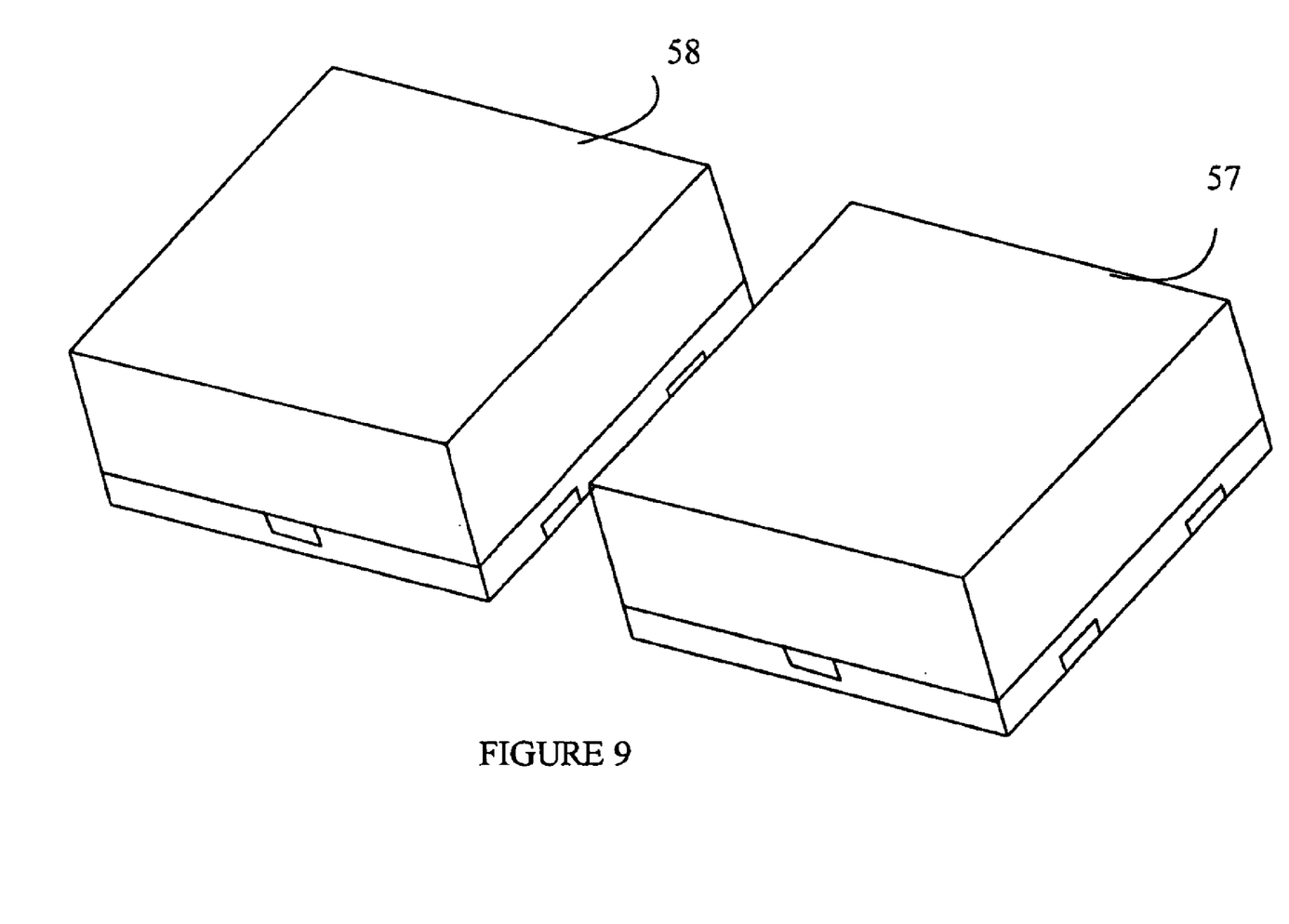
FIG. 9 illustrates the individual packaged dies that have been separated by sawing the sheet into individual dies.

Refer now to FIG. 8, which is a perspective view of the packaged parts after the final molding operation. At this point, the individual packaged dies are separated by sawing the sheet into individual dies leaving the packaged dies as shown in FIG. 9 at 57 and 58. The spring members and the connecting traces that were used to hold the lead frame together as a single sheet during the preceding operations are removed by the sawing operation.

Various modifications to the present invention will become apparent to those skilled in the art from the foregoing description and accompanying drawings. Accordingly, the present invention is to be limited solely by the scope of the following claims.

What is claimed is:

1. A method for packaging a plurality of dies, said method comprising:

provoding a structural member comprising a base member having first and second surfaces, said base member comprising a plurality of mounting stations, each mounting station comprising a cavity wall that surrounds that mounting station and extends from said first surface thereby forming an open cavity around said mounting station;

attaching each die to a corresponding one of said mounting stations;

positioning a lid sheet over said structural member, said lid sheet comprising a plurality of covers for closing said cavities said covers being connected to one another by connection members;

placing said structural member with said positioned lid sheet in a mold with a molding compound in contact with said lid sheet, said mold having a surface that forces said covers against said cavity while forcing said molding compound between said cavity walls; and causing said molding compound to solidify.

2. The method of claim 1 wherein one of said connection members comprises a spring member that extends away from said covers and said first surface.

3. The method of claim 2 wherein said mold surface is in contact with said spring member when said molding compound is forced between said cavity walls.

4. The method of claim 1 wherein one of said mounting stations comprises a wire bonding pad and wherein said die is connected to said wire bonding pad when said die is attached to said mounting station.

5. The method of claim 1 wherein one of said mounting stations comprises a die mounting pad and wherein said die is connected to said die mounting pad by a layer of adhesive when said die is attached to said mounting station.

6. The method of claim 5 wherein said die mounting pad comprises a heat sink for removing heat from said die.

7. The method of claim 1 wherein said base member comprises a lead frame that is partially encased in a mold compound.

* * * * *